United States Patent
Son et al.

(10) Patent No.: US 12,200,876 B2
(45) Date of Patent: Jan. 14, 2025

(54) METHOD AND ELECTRONIC DEVICE FOR IMPROVING ANTENNA PERFORMANCE

(71) Applicant: Samsung Electronics Co., Ltd., Suwon-si (KR)

(72) Inventors: Seongho Son, Suwon-si (KR); Yongyoun Kim, Suwon-si (KR); Wanchul Seung, Suwon-si (KR); Jongsung Lee, Suwon-si (KR); Sanguk Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 488 days.

(21) Appl. No.: 17/549,123

(22) Filed: Dec. 13, 2021

(65) Prior Publication Data
US 2022/0132682 A1    Apr. 28, 2022

Related U.S. Application Data

(63) Continuation of application No. PCT/KR2021/015022, filed on Oct. 25, 2021.

(30) Foreign Application Priority Data

Oct. 26, 2020   (KR) .................... 10-2020-0139467

(51) Int. Cl.
*H01Q 1/22* (2006.01)
*G06F 1/16* (2006.01)
(Continued)

(52) U.S. Cl.
CPC ......... *H05K 5/0017* (2013.01); *G06F 1/1652* (2013.01); *G06F 1/1656* (2013.01);
(Continued)

(58) Field of Classification Search
CPC ............ H01Q 1/22; H01Q 1/24; H01Q 1/243; H01Q 1/48; H01Q 9/0457
See application file for complete search history.

(56) References Cited

U.S. PATENT DOCUMENTS

2005/0261019 A1   11/2005   Lee et al.
2011/0111807 A1   5/2011   Kido
(Continued)

FOREIGN PATENT DOCUMENTS

CN   207531214 U   6/2018
JP   H10-149108 A   6/1998
(Continued)

OTHER PUBLICATIONS

International Search Report with Written Opinion dated Feb. 4, 2022, issued in International Patent Application No. PCT/KR2021/015022.

(Continued)

*Primary Examiner* — Hoang V Nguyen
(74) *Attorney, Agent, or Firm* — Jefferson IP Law, LLP

(57) ABSTRACT

An electronic device is provided. The electronic device includes a first housing, a second housing foldably connected to the first housing through a hinge device, a flexible display disposed to be supported by the second housing through the hinge device from the first housing, and a protective frame disposed on the second housing with edges of the flexible display interposed, wherein a conductive member is disposed based on at least one pattern between the protective frame and the edges of the flexible display.

21 Claims, 12 Drawing Sheets

(51) Int. Cl.
  *H01Q 1/24* (2006.01)
  *H05K 5/00* (2006.01)
  *H05K 5/02* (2006.01)
  *H05K 5/03* (2006.01)
  *H05K 9/00* (2006.01)

(52) U.S. Cl.
  CPC ............ *H01Q 1/22* (2013.01); *H05K 5/0226* (2013.01); *H05K 5/03* (2013.01); *H05K 9/0079* (2013.01)

(56) References Cited

U.S. PATENT DOCUMENTS

| | | |
|---|---|---|
| 2012/0099057 A1 | 4/2012 | Kim |
| 2012/0327328 A1 | 12/2012 | Kim et al. |
| 2013/0088406 A1 | 4/2013 | Hamada et al. |
| 2013/0207853 A1 | 8/2013 | Yamamoto et al. |
| 2016/0105951 A1 | 4/2016 | Lee |
| 2017/0179423 A1 | 6/2017 | Kwon et al. |
| 2018/0070460 A1 | 3/2018 | Han |
| 2019/0350081 A1 | 11/2019 | Park et al. |

FOREIGN PATENT DOCUMENTS

| | | |
|---|---|---|
| JP | 2007-148275 A | 6/2007 |
| JP | 2013-165409 A | 8/2013 |
| KR | 10-2004-0011409 A | 2/2004 |
| KR | 10-0619852 B1 | 8/2006 |
| KR | 10-1061109 B1 | 8/2011 |
| KR | 10-2012-0042474 A | 5/2012 |
| KR | 10-2015-0075604 A | 7/2015 |
| KR | 10-2017-0071986 A | 6/2017 |
| KR | 10-1822657 B1 | 1/2018 |
| KR | 10-2018-0026598 A | 3/2018 |
| KR | 10-1978204 B1 | 5/2019 |
| KR | 10-2207839 B1 | 1/2021 |

OTHER PUBLICATIONS

Became aware on Sep. 13, 2023 from Korean Accelerated Examination Application for Korean Patent Application No. 10-2020-0139467.

Indian Office Action dated Nov. 24, 2023, issued in Indian Patent Application No. 202337018190.

Korean Office Action dated Nov. 28, 2023, issued in Korean Patent Application No. 10-2020-0139467.

Extended European Search Report dated Dec. 1, 2023, issued in European Patent Application No. 21886727.3.

METHOD AND ELECTRONIC DEVICE FOR IMPROVING ANTENNA PERFORMANCE

CROSS-REFERENCE TO RELATED APPLICATION(S)

This application is a continuation application, claiming priority under § 365 (c), of an International application No. PCT/KR2021/015022, filed on Oct. 25, 2021, which is based on and claims the benefit of a Korean patent application number 10-2020-0139467, filed on Oct. 26, 2020, in the Korean Intellectual Property Office, the disclosure of which is incorporated by reference herein in its entirety.

TECHNICAL FIELD

The disclosure relates to a method and an electronic device for improving an antenna performance.

BACKGROUND ART

Recently, with the development of technology, electronic devices have gradually become slimmer, and have been improved so as to increase stiffness, reinforce the design aspect, and differentiate functional elements thereof at the same time. The electronic devices have deviated from the uniform rectangular shape, and has been gradually changed to various shapes. For example, an electronic device may have a transformable structure which is convenient to carry and which can use a large-screen display when in use. For example, as part of the transformable structure, the electronic device may include a foldable electronic device including a flexible display which operates in a manner that at least two housings are folded or unfolded to or from each other. Further, the electronic device may include a rollable electronic device which can expand a display area through a housing combination structure operating in a sliding manner and a flexible display being supported thereby. Various improvements in accordance with the foldable electronic device and/or the rollable electronic device have been prepared.

The above information is presented as background information only to assist with an understanding of the disclosure. No determination has been made, and no assertion is made, as to whether any of the above might be applicable as prior art with regard to the disclosure.

DISCLOSURE

Technical Problem

A foldable electronic device may include a hinge device and a first housing and a second housing being movably connected to each other through the hinge device. Since a foldable electronic device may operate in an in-folding and/or out-folding manner since the first housing is rotated within a range of 0 to 360 degrees against the second housing through the hinge device. The foldable electronic device may include a flexible display being disposed to cross the first housing and the second housing in a state where the foldable electronic device is open by 180 degrees.

The flexible display may include a bendable display panel. The display panel may include a bending part extending on one side, electrically connected (e.g., grounded) to a conductive plate disposed on a rear side of the flexible display, and on which a control circuit is disposed. For example, the flexible display may be disposed on the foldable electronic device, and when the display panel is seen from above, the bending part may protrude outward from an edge of the display panel.

Static electricity flowing from an outside may flow into the inside of the foldable electronic device through the edge of the flexible display. Such static electricity may be induced to a conductive plate electrically connected to a common ground of the electronic device through a conductive member disposed on the bending part. For example, the conductive member for inducing the static electricity may hide an antenna radiation area at least partly, and thus may cause a problem in that the radiation performance of the antenna becomes degraded.

Aspects of the disclosure are to address at least the above-mentioned problems and/or disadvantages and to provide at least the advantages described below. Accordingly, an aspect of the disclosure, since the conductive member is designed in the form of discontinuous patterns while being periodically repeated, is to provide an electronic device that improves the antenna performance.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a first housing, a second housing foldably connected to the first housing through a hinge device, a flexible display disposed to be supported by the second housing through the hinge device from the first housing, and a protective frame disposed on the second housing with edges of the flexible display interposed, wherein a conductive member is disposed based on at least one pattern between the protective frame and the edges of the flexible display.

Advantageous Effects

According to the electronic device according to various embodiments of the disclosure, the conductive member for inducing the static electricity flowing through the edges of the flexible display can be disposed. The radiation performance of the antenna can be improved by inducing the static electricity to ground using the conductive member including the discontinuous patterns being repeated at regular intervals. In addition, various effects being directly or indirectly grasped through the present document can be provided.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR DISCLOSURE

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
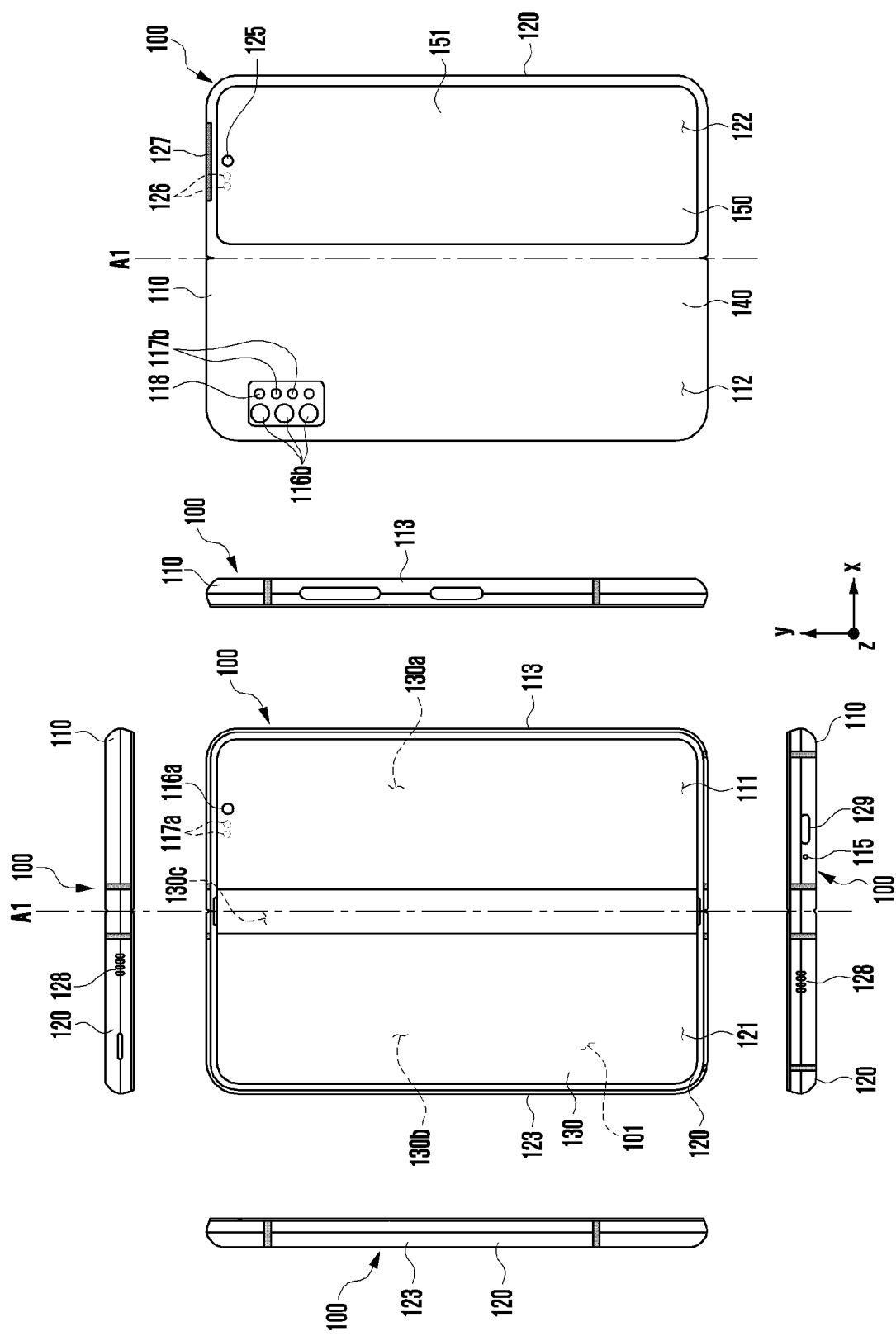
FIG. 1 is a view illustrating an unfolded state of an electronic device according to an embodiment of the disclosure.

FIG. 1 is a view illustrating an unfolded state of an electronic device according to an embodiment of the disclosure.

Figure 2:
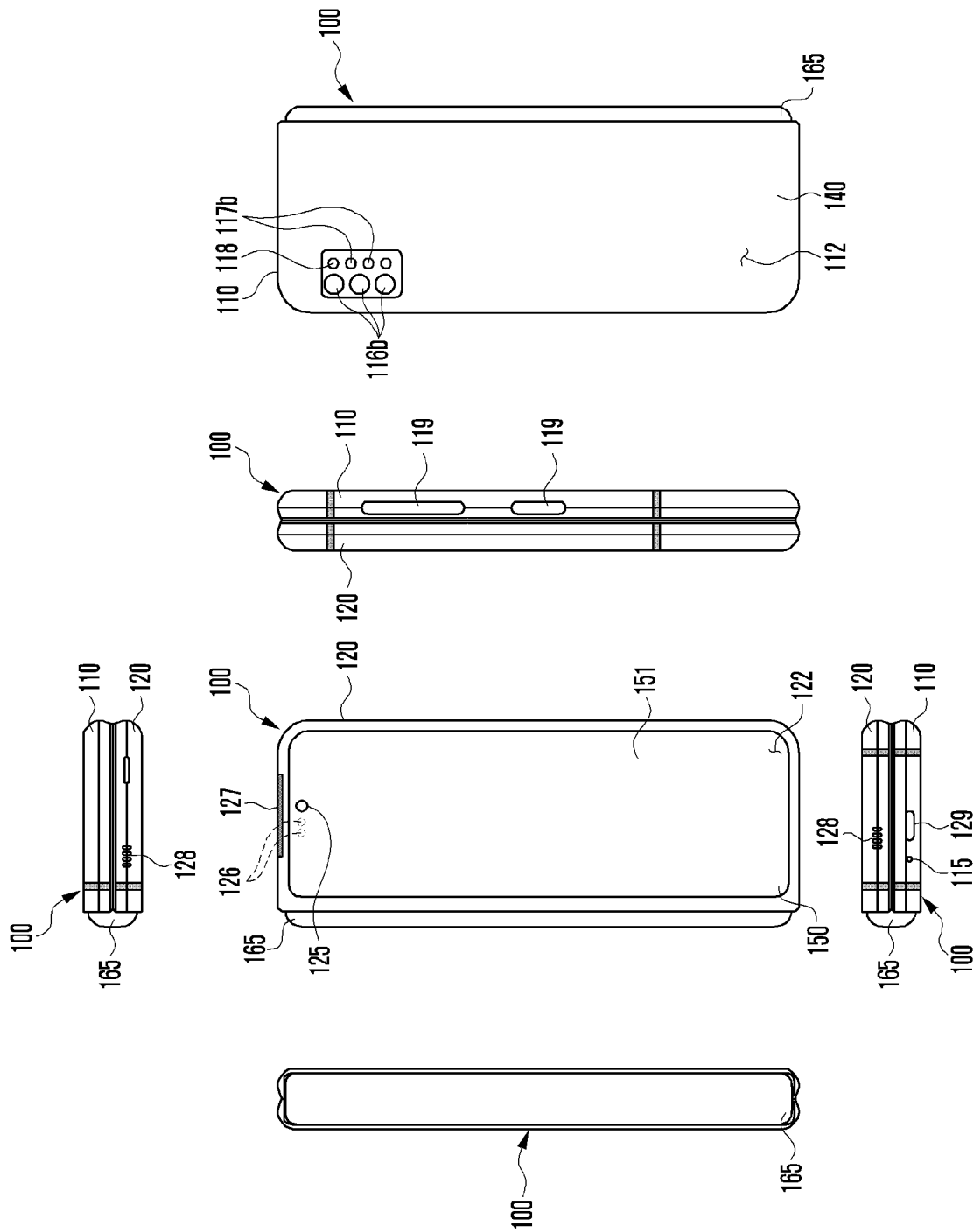
FIG. 2 is a view illustrating a folded state of an electronic device of FIG. 1 according to an embodiment of the disclosure.

FIG. 2 is a view illustrating a folded state of an electronic device of FIG. 1 according to an embodiment of the disclosure.

Referring to FIGS. 1 and 2, an electronic device 100 may include a pair of housings 110 and 120 (e.g., foldable housings) rotatably combined with each other based on a folding axis A1 through a hinge device (e.g., hinge device 164 of FIG. 3) so as to be folded with each other, a first display 130 (e.g., flexible display, foldable display, and/or main display) disposed through the pair of housings 110 and 120, and a second display 151 (e.g., sub-display). According to an embodiment, the hinge device (e.g., hinge device 164 of FIG. 3) may be disposed not to be seen from an outside through the first housing 110 and the second housing 120 in a folded state, and may be disposed not to be seen from the outside through a hinge cover 165 protecting the hinge device and covering a foldable part in an unfolded state. In the present document, a side on which the first display 130 is disposed may be defined as a front side of the electronic device 100, and an opposite side of the front side may be defined as a rear side of the electronic device 100. Further, a side surrounding a space between the front side and the rear side may be defined as a lateral side of the electronic device 100.

Figure 3:
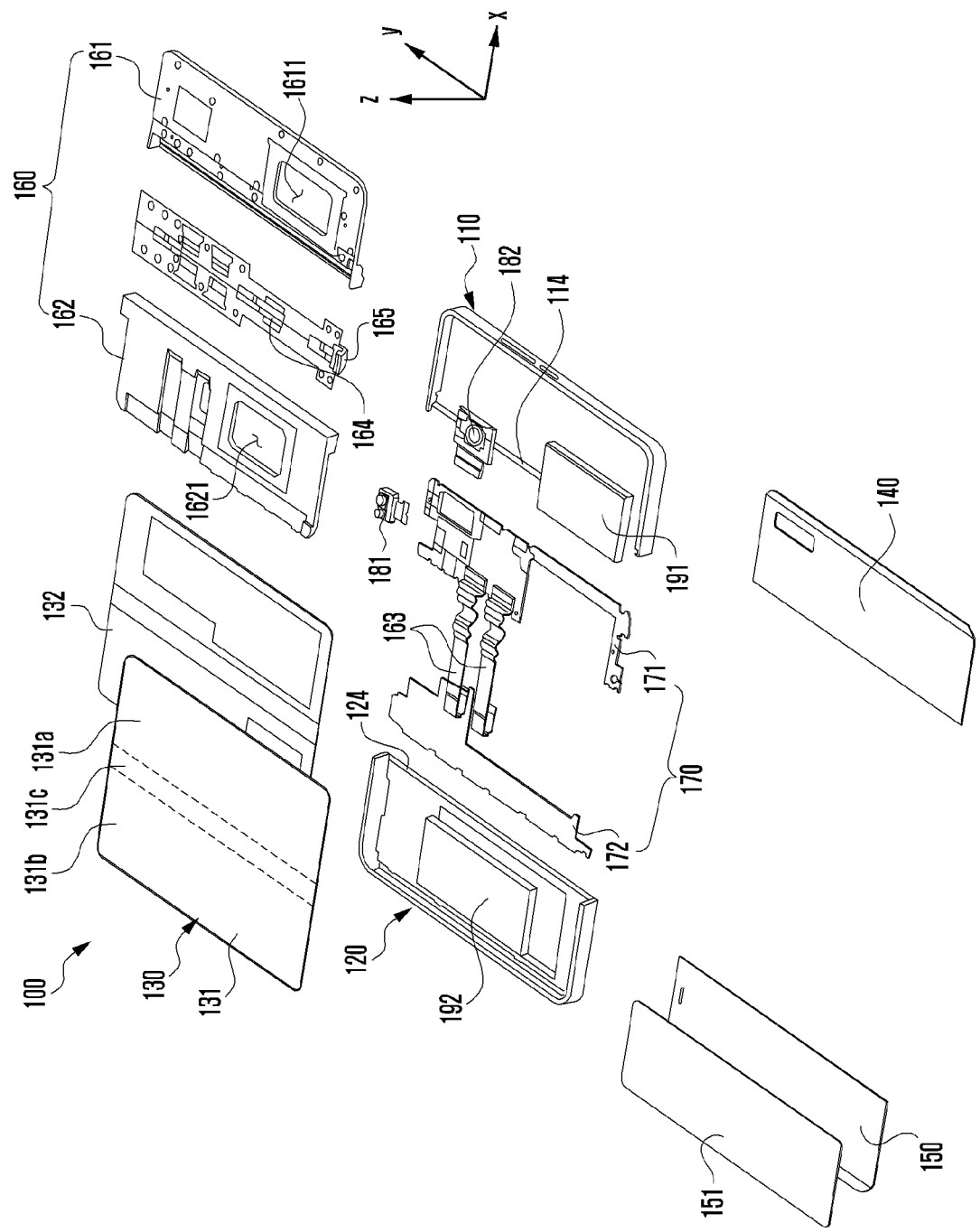
FIG. 3 is an exploded perspective view of an electronic device according to an embodiment of the disclosure.

According to various embodiments, the pair of housings 110 and 120 may include the first housing 110 and the second housing 120 foldably disposed to each other through the hinge device (e.g., hinge device 164 of FIG. 3). According to an embodiment, the pair of housings 110 and 120 may not be limited to the shape and combination as illustrated in FIGS. 1 and 2, and may be implemented by a different shape or part combinations and/or association. According to an embodiment, the first housing 110 and the second housing 120 may be disposed on both sides around the folding axis A1, and may have a symmetric shape as a whole about the folding axis A1. According to a certain embodiment, the first housing 110 and the second housing 120 may be asymmetrically folded based on the folding axis A1. According to an embodiment, the first housing 110 and the second housing 120 may have different angles or distances between them depending on whether the electronic device 100 is in an unfolded state, a folded state, or an intermediate state.

According to various embodiments, in the unfolded state of the electronic device 100, the first housing 110 may be connected to the hinge device (e.g., hinge device 164 of FIG. 3), and may include a first side 111 disposed to be directed toward the front side of the electronic device 100, a second side 112 directed toward an opposite direction of the first side 111, and a first side member 113 surrounding at least a part of a first space between the first side 111 and the second side 112. According to an embodiment, the second housing 120 may be connected to the hinge device (e.g., hinge device 164 of FIG. 3) in the unfolded state of the electronic device 100, and may include a third side 121 disposed to be directed toward the front side of the electronic device 100, a fourth side 122 directed toward an opposite direction of the third side 121, and a second side member 123 surrounding at least a part of a second space between the third side 121 and the fourth side 122. According to an embodiment, the first side 111 may be directed in the same direction as that of the third side 121 in the unfolded state, and may face the third side 121 in the folded state. According to an embodiment, the electronic device 100 may include a recess 101 formed to accommodate the first display 130 through structural combination of the first housing 110 and the second housing 120. According to an embodiment, the recess 101 may have substantially the same size as that of the first display 130.

According to various embodiments, the hinge cover 165 may be disposed between the first housing 110 and the second housing 120 so as to hide the hinge device (e.g., hinge device 164 of FIG. 3). According to an embodiment, the hinge cover 165 may be hidden or exposed to an outside by parts of the first housing 110 and the second housing 120 depending on the unfolded state, the folded state, or the intermediate state of the electronic device 100. For example, in the unfolded state of the electronic device 100, the hinge cover 165 may be hidden by the first housing 110 and the second housing 120, and may not be exposed. According to an embodiment, in case that the electronic device 100 is in the folded state, the hinge cover 165 may be exposed to the outside between the first housing 110 and the second housing 120. According to an embodiment, in case of the intermediate state where the first housing 110 and the second housing 120 are folded with a certain angle, the hinge cover 165 may be at least partly exposed to the outside of the electronic device 100 between the first housing 110 and the second housing 120. For example, an area in which the hinge cover 165 is exposed to the outside may be smaller than that in a completely folded state. According to an embodiment, the hinge cover 165 may include a curved side.

According to various embodiments, in case that the electronic device 100 is in the unfolded state (e.g., state of FIG. 1), the first housing 110 and the second housing 120 form an angle of 180 degrees, and a first area 130*a*, a folding area 130*c*, and a second area 130*b* of the first display 130 may be disposed to form a plane and to be directed in the same direction. As another embodiment, in case that the electronic device 100 is in the unfolded state, the first housing 110 may be rotated at an angle of 360 degrees against the second housing 120, and may be reversely folded so that the second side 112 and the fourth side 122 face each other (out folding type).

According to various embodiments, in case that the electronic device 100 is in the folded state (e.g., state of FIG. 2), the first side 111 of the first housing 110 and the third side 121 of the second housing 120 may be disposed to face each other. In this case, the first area 130*a* and the second area 130*b* of the first display 130 may form a narrow angle (e.g., in the range of 0 to 10 degrees) with each other through the folding area 130*c*, and may be disposed to face each other. According to an embodiment, at least a part of the folding area 130*c* may be formed as a curved side having a certain curvature radius. According to an embodiment, in case that the electronic device 100 is in the intermediate state, the first housing 110 and the second housing 120 may be disposed with a certain angle. In this case, the first area 130*a* and the second area 130*b* of the first display 130 may form an angle that is larger than the angle in the folded state and smaller than the angle in the unfolded state, and the curvature radius of the folding area 130*c* may be larger than that in the folded state. In a certain embodiment, the first housing 110 and the second housing 120 may form a designated folding angle at which they stop folding between the folded state and the unfolded state through the hinge device (e.g., hinge device 164 of FIG. 3) (free stop function). In a certain embodiment, the first housing 110 and the second housing 120 may operate as being pressed in a folding direction or in an unfolding direction based on a designated inflection angle through the hinge device (e.g., hinge device 164 of FIG. 3).

According to various embodiments, the electronic device 100 may include at least one of displays 130 and 151 disposed on the first housing 110 and/or the second housing 120, an input device 115, sound output devices (i.e., speakers 127 and 128), sensor modules 117*a*, 117*b*, and 126, camera devices 116*a*, 116*b*, and 125, a key input device 119, an indicator (not illustrated), or a connector port 129. In a certain embodiment, the electronic device 100 may omit at least one of constituent elements, or may additionally include at least one of other constituent elements.

According to various embodiments, the at least one display 130 and 151 may include the first display 130 (e.g., flexible display) disposed to be supported by the third side 121 of the second housing 120 through the hinge device (e.g., hinge device 164 of FIG. 3) from the first side 111 of the first housing 110, and the second display 151 disposed to be seen from the outside through the fourth side 122 in the inner space of the second housing 120. According to an embodiment, the first display 130 may be mainly used in the unfolded state of the electronic device 100, and the second display 151 may be mainly used in the folded state of the electronic device 100. According to an embodiment, in the intermediate state of the electronic device 100, the first display 130 or the second display 151 may be used based on the folding angle of the first housing 110 and the second housing 120.

According to various embodiments, the first display 130 may be disposed in a space formed by the pair of housings 110 and 120. For example, the first display 130 may be seated in a recess 101 formed by the pair of housings 110 and 120, and may be disposed to occupy substantially most of the front side of the electronic device 100. According to an embodiment, the first display 130 may include the flexible display of which at least a partial area can be transformed into a planar or curved side. According to an embodiment, the first display 130 may include the first area 130*a* facing the first housing 110, the second area 130*b* facing the second housing 120, and the folding area 130*c* connecting the first area 130*a* and the second area 130*b*, and facing the hinge device (e.g., hinge device 164 of FIG. 3). According to an embodiment, the area division of the first display 130 is a physical division by a pair of housings 110 and 120 and the hinge device (e.g., hinge device 164 of FIG. 3), and the first display 130 may substantially display one seamless full screen through the pair of housings 110 and 120 and the hinge device (e.g., hinge device 164 of FIG. 3). According to an embodiment, the first area 130*a* and the second area 130*b* may have a symmetric shape as a whole based on the folding area 130*c*, or may have a partly asymmetric shape.

According to various embodiments, the electronic device 100 may include a first rear cover 140 disposed on the second side 112 of the first housing 110, and a second rear cover 150 disposed on the fourth side 122 of the second housing 120. In a certain embodiment, at least a part of the first rear cover 140 may be formed in a body with the first side member 113. In a certain embodiment, at least a part of the second rear cover 150 may be formed in a body with the second side member 123. According to an embodiment, at least one of the first rear cover 140 and the second rear cover 150 may be formed through a substantially transparent plate (e.g., glass plate including various coating layers or polymer plate) or an opaque plate. According to an embodiment, the first rear cover 140 may be formed through the opaque plate, such as coated or colored glass, ceramic, polymer, metal (e.g., aluminum, stainless steel (STS), or magnesium), or a combination of at least two of the above materials. According to an embodiment, the second rear cover 150 may be formed through a substantially transparent plate, such as glass or polymer. Accordingly, the second display 151 may be disposed to be seen from the outside through the second rear cover 150 in the inner space of the second housing 120.

According to various embodiments, the input device 115 may include a microphone. In a certain embodiment, the input device 115 may include a plurality of microphones disposed to be able to detect the direction of sound. According to an embodiment, the sound output devices may include speakers 127 and 128. According to an embodiment, the speakers 127 and 128 may include a speaker 127 disposed through the fourth side 122 of the second housing 120 and an external speaker 128 disposed through the side member of the second housing 120. In a certain embodiment, the microphone (i.e., input device 115), the speakers 127 and 128, and the connector port 129 may be disposed in the spaces of the first housing 110 and/or the second housing 120, and may be exposed to an external environment through at least one hole formed on the first housing 110 and/or the second housing 120. In a certain embodiment, the holes formed on the first housing 110 and/or the second housing 120 may be commonly used for the microphone (i.e., input device 115) and the speakers 127 and 128. In a certain embodiment, the sound output devices may include a speaker (e.g., piezo-electric speaker) operating in a state where the holes formed on the first housing 110 and/or the second housing 120 are excluded.

According to various embodiments, the camera devices 116a, 116b, and 125 may include the first camera device 116a disposed on the first side 111 of the first housing 110, the second camera device 116b disposed on the second side 112 of the first housing 110, and/or the third camera device 125 disposed on the fourth side 122 of the second housing 120. According to an embodiment, the electronic device 100 may include a flash 118 disposed near the second camera device 116b. According to an embodiment, the flash 118 may include, for example, a light emitting diode or a xenon lamp. According to an embodiment, the camera devices 116a, 116b, and 125 may include one or a plurality of lenses, an image sensor, and/or an image signal processor. In a certain embodiment, at least one of the camera devices 116a, 116b, and 125 may include two or more lenses (wide-angle lens and telephoto lens) and image sensors, and may be disposed together on any one side of the first housing 110 and/or the second housing 120.

According to various embodiments, the sensor modules 117a, 117b, and 126 may generate electrical signals or data values corresponding to an internal operation state of the electronic device 100 or an external environment state. According to an embodiment, the sensor modules 117a, 117b, and 126 may include the first sensor module 117a disposed on the first side 111 of the first housing 110, the second sensor module 117b disposed on the second side 112 of the first housing 110, and/or the third sensor module 126 disposed on the fourth side 122 of the second housing 120. In a certain embodiment, the sensor modules 117a, 117b, and 126 may include at least one of a gesture sensor, a grip sensor, a color sensor, an infrared (IR) sensor, an illuminance sensor, an ultrasonic sensor, an iris recognition sensor, or a distance detection sensor (time of flight (TOF) sensor or RiDAR scanner).

According to various embodiments, the electronic device 100 may further include at least one of non-illustrated sensor modules, for example, a barometric pressure sensor, a magnetic sensor, a biosensor, a temperature sensor, a humidity sensor, or a fingerprint recognition sensor. In a certain embodiment, the fingerprint recognition sensor may be disposed through at least one of the first side member 113 of the first housing 110 and/or the second side member 123 of the second housing 120.

According to various embodiments, the key input device 119 may be disposed to be exposed to the outside through the first side member 113 of the first housing 110. In a certain embodiment, the key input device 119 may be disposed to be exposed to the outside through the second side member 123 of the second housing 120. In a certain embodiment, the electronic device 100 may not include parts or all of the above-mentioned key input devices 119, and the key input device 119 that is not included may be implemented in other forms, such as a soft key, on the at least one display 130 and 151. As another embodiment, the key input device 119 may be implemented using a pressure sensor included in the at least one display 130 and 151.

According to various embodiments, the connector port 129 may accommodate connectors (e.g., universal serial bus (USB) connector or interface connector port (IF) module) for transmitting or receiving a power and/or data to or from an external electronic device. In a certain embodiment, the connector port 129 may perform a function for transmitting or receiving an audio signal to or from the external electronic device together, or may further include a separate connector port (e.g., ear-jack hole) for performing audio signal transmission/reception.

According to various embodiments, at least one camera device 116a and 125 among the camera devices 116a, 116b, and 125, at least one sensor module 117a and 126 among the sensor modules 117a, 117b, and 126, and/or the indicator may be disposed to be exposed through the at least one display 130 and 151. For example, the at least one camera device 116a and 125, the at least one sensor module 117a and 126, and/or the indicator may be disposed under a display area of the displays 130 and 151 in the inner space of the at least one housing 110 and 120, and may be disposed to come in contact with the external environment through an opening perforated up to the cover member (e.g., window layer (not illustrated) of the first display 130 and/or the second rear cover 150). As another embodiment, some camera devices or sensor module 104 may be disposed to perform their functions without being visually exposed through the display. For example, the area of the display 130 (e.g., display panel), which faces the camera device and/or the sensor module, may not require the perforated opening.

FIG. 3 is an exploded perspective view of an electronic device according to an embodiment of the disclosure.

Referring to FIG. 3, the electronic device 100 may include the first display 130, the second display 151, a support member assembly 160, at least one printed circuit board 170, the first housing 110, the second housing 120, the first rear cover 140, and the second rear cover 150.

According to various embodiments, the first display 130 may include a display panel 131 (e.g., flexible display panel), and one or more plates 132 or layers on which the display panel 131 (e.g., flexible display panel) is seated. According to an embodiment, the one or more plates 132 may include a conductive plate (e.g., Cu sheet or SUS sheet) disposed between the display panel 131 and the support member assembly 160. According to an embodiment, the one or more plates 132 may be formed to have substantially the same area as that of the first display 130, and the area facing the folding area 130c of the first display 130 may be bendably formed. According to an embodiment, the one or more plates 132 may include at least one subsidiary material layer (e.g., graphite member) disposed on the rear side of the display panel 131. According to an embodiment, the one or more plates 132 may be formed in the shape corresponding to the display panel 131.

According to various embodiments, the second display 151 may be disposed in a space between the second housing 120 and the second rear cover 150. According to an embodiment, the second display 151 may be disposed to be seen from the outside through substantially the total area of the second rear cover 150 in the space between the second housing 120 and the second rear cover 150.

According to various embodiments, the support member assembly 160 may include a first support member 161 (e.g., first support plate), a second support member 162 (e.g., second support plate), the hinge device 164 disposed between the first support member 161 and the second support member 162, the hinge cover 165 covering the hinge device 164 as seen from the outside of the hinge device 164, and at least one wiring member 163 (e.g., flexible printed circuit board (FPCB)) crossing the first support member 161 and the second support member 162. According to an embodiment, the support member assembly 160 may be disposed between the one or more plates 132 and the at least one printed circuit board 170. According to an embodiment, the first support member 161 may be disposed between the first area 131*a* of the first display 130 and the first printed circuit board 171. According to an embodiment, the second support member 162 may be disposed between the second area 131*b* of the first display 130 and the second printed circuit board 172. According to an embodiment, inside the support member assembly 160, the at least one wiring member 163 and at least a part of the hinge device 164 may be disposed. The at least one wiring member 163 may be disposed in a direction (e.g., x-axis direction) crossing the first support member 161 and the second support member 162. According to an embodiment, the at least one wiring member 163 may be disposed in a direction (e.g., x-axis direction) that is vertical to the folding axis (e.g., y axis or folding axis A of FIG. 1) of the folding area 130*c*.

According to various embodiments, the at least one printed circuit board 170 may include a first printed circuit board 171 disposed to face the first support member 161 and a second printed circuit board 172 disposed to face the second support member 162. According to an embodiment, the first printed circuit board 171 and the second printed circuit board 172 may be disposed in the inner space that is formed by the support member assembly 160, the first housing 110, the second housing 120, the first rear cover 140, and/or the second rear cover 150. According to an embodiment, the first printed circuit board 171 and the second printed circuit board 172 may include a plurality of electronic components disposed to implement various functions of the electronic device 100.

According to various embodiments, the electronic device may include the first printed circuit board 171 disposed in the space formed through the first support member 161 in the first space of the first housing 110, a first battery 191 disposed at a location facing a first swelling hole 1611 of the first support member 161, at least one camera device 182 (e.g., first camera device 116*a* of FIG. 1 and/or second camera device 116*b*), or at least one sensor module 181 (e.g., first sensor module 117*a* of FIG. 1 and/or second sensor module 117*b*). According to an embodiment, the second space of the second housing 120 may include the second printed circuit board 172 disposed in the second space formed through the second support member 162, and a second battery 192 disposed at a location facing a second swelling hole 1621 of the second support member 162. According to an embodiment, the first housing 110 and first support member 161 may be integrally formed. According to an embodiment, the second housing 120 and the second support member 162 may also be formed in a body.

According to various embodiments, the first housing 110 may include a first rotation support side 114, and the second housing 120 may include a second rotation support side 124 corresponding to the first rotation support side 114. According to an embodiment, the first rotation support side 114 and the second rotation support side 124 may include a curved side corresponding (naturally connected) to a curved side included in the hinge cover 165. According to an embodiment, in the unfolded state of the electronic device 100, the first rotation support side 114 and the second rotation support side 124 may cover the hinge cover 165, and may not expose the hinge cover 165 to the rear side of the electronic device 100, or may minimally expose the hinge cover 165. According to an embodiment, in the folded state of the electronic device 100, the first rotation support side 114 and the second rotation support side 124 may be rotated along the curved side included in the hinge cover 165, and may maximally expose the hinge cover 165 to the rear side of the electronic device 100.

Figure 4A:
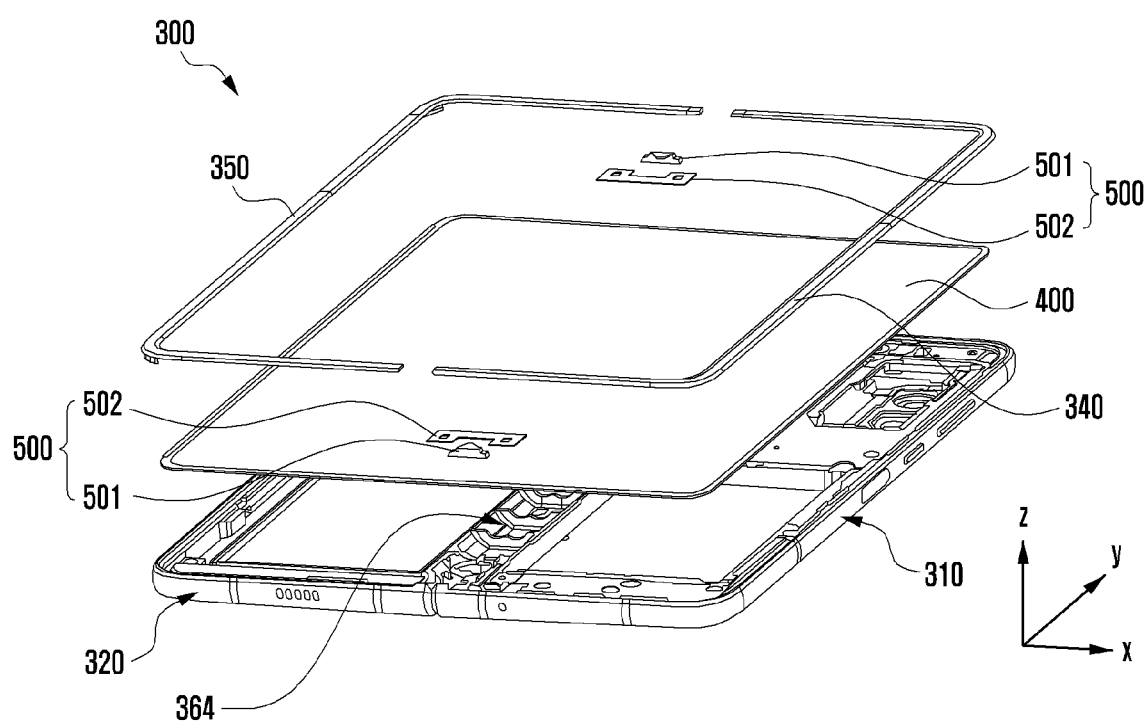
FIG. 4A is an exploded perspective view of an electronic device including a flexible display according to an embodiment of the disclosure.

FIG. 4A is an exploded perspective view of an electronic device including a flexible display according to an embodiment of the disclosure.

Figure 4B:
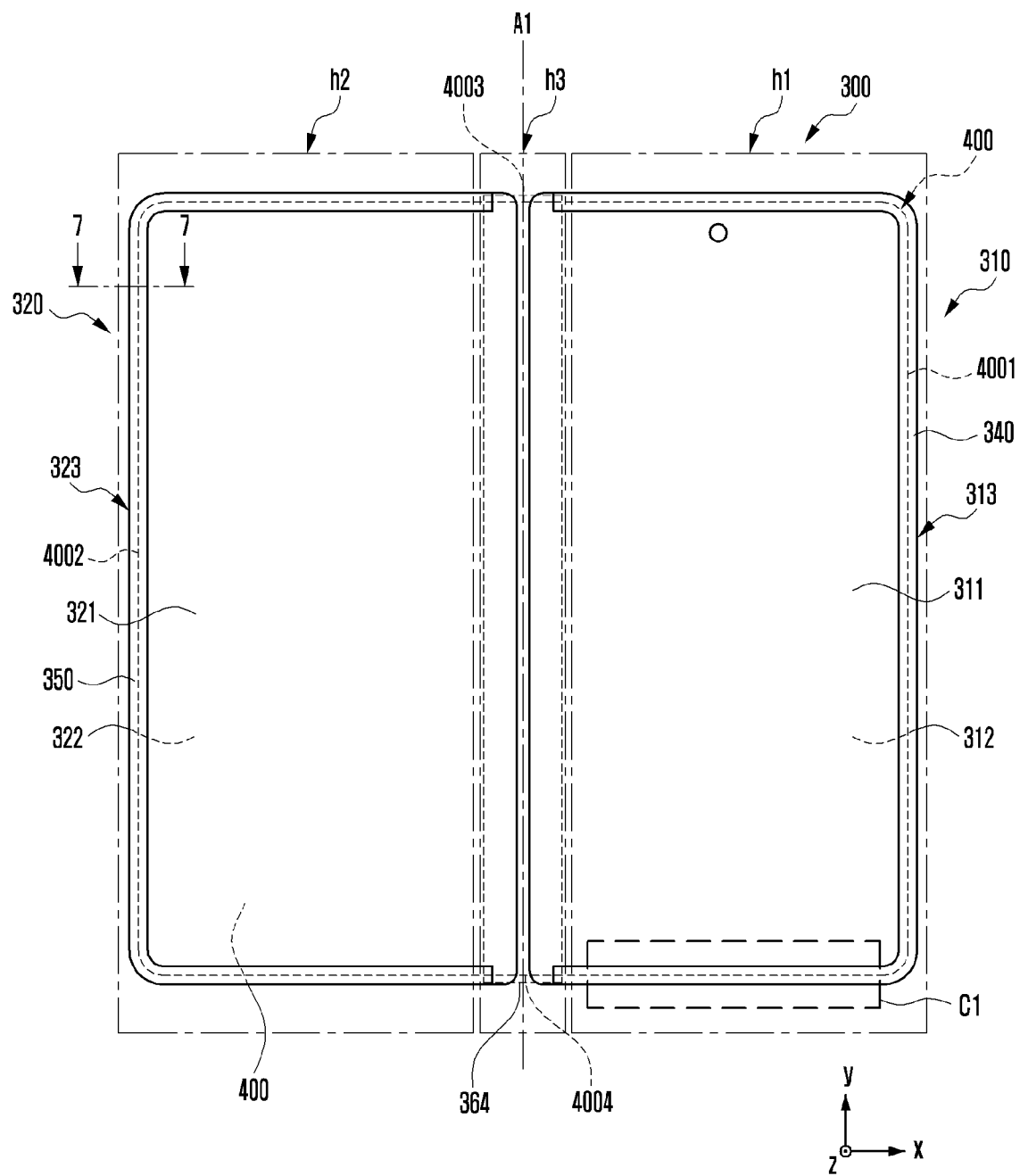
FIG. 4B is a view illustrating the configurations by areas of an electronic device according to an embodiment of the disclosure.

FIG. 4B is a view illustrating the configurations by areas of an electronic device according to an embodiment of the disclosure.

An electronic device 300 of FIGS. 4A and 4B may be similar to the electronic device 100 of FIG. 1 at least partly, and may further include other embodiments of the electronic device.

Referring to FIGS. 4A and 4B, the electronic device 300 (e.g., electronic device 100 of FIG. 1) may include a first housing 310 (e.g., first housing 110 of FIG. 1) (e.g., first housing structure) including a first side 311 (e.g., first side 111 of FIG. 1), a second side 312 (e.g., second side 112 of FIG. 1) directed in an opposite direction to the first side 311, and a first side member 313 (e.g., first side member 113 of FIG. 1) surrounding a first space between the first side 311 and the second side 312. According to an embodiment, in the unfolded state, the electronic device 300 may include a second housing 320 (e.g., second housing 120 of FIG. 1) (e.g., second housing structure) including a third side 321 (e.g., third side 121 of FIG. 1) directed in the same direction as the first side 311, a fourth side 322 (e.g., fourth side 122 of FIG. 1) directed in the same direction as the second side 312, and a second side member 323 (e.g., second side member 123 of FIG. 1) surrounding a second space between the third side 321 and the fourth side 322. According to an embodiment, the first housing 310 and the second housing 320 may be foldably installed based on the folding axis A1 with each other through a hinge device 364 (e.g., hinge device 164 of FIG. 3). For example, the electronic device 300 may maintain the folded or unfolded state by rotating the first housing 310 and the second housing 320 to each other through the hinge device 364. According to an embodiment, in the folded state of the electronic device 300, the first side 311 and the third side 321 may face each other, and in the unfolded state, the first side 311 and the third side 321 may be directed in the same direction. According to an embodiment, the electronic device 300 may include a flexible display 400 (e.g., display 130 of FIG. 1) disposed to cross the first side 311 and the third side 321 at least partly. According to an embodiment, a flexible display 400 may be disposed to be supported by at least partial areas of the first housing 310, the hinge device 364, and the second housing 320.

According to various embodiments, the electronic device 300 (e.g., electronic device 100 of FIG. 1) may include a first area h1 facing the first housing 310, a second area h2 facing the second housing 320, and a folding area h3 facing the hinge device 364. According to an embodiment, the electronic device 300 may operate in a manner that the first housing 310 corresponding to the first area h1 is folded or unfolded against the second housing 320 corresponding to the second area h2 through the hinge device 364 corresponding to the folding area h3.

According to various embodiments, the electronic device 300 may include at least one protective frame 340 and 350 (e.g., decorative member or deco) disposed on the top of the flexible display 400. According to an embodiment, the at least one protective frame 340 and 350 may include the first protective frame 340 disposed on the top of the flexible display 400 in the first area h1, and second protective frame 350 disposed on the top of the flexible display 400 in the second area h2. According to an embodiment, the protective frames 340 and 350 may be formed of a polymer material or a metal material, and may be disposed on the respective housings 310 and 320 through at least one combination method of bonding, taping, fusion, or structural combination. According to an embodiment, the protective frames 340 and 350 may be disposed in the form of at least partly surrounding edges of the flexible display 400.

According to various embodiments, the flexible display 400 may include a first edge 4001 facing at least a part of the first housing 310, a second edge 4002 facing at least a part of the second housing 320, a third edge 4003 connecting one end of the first edge 4001 and one end of the second edge 4002, and a fourth edge 4004 connecting the other end of the first edge 4001 and the other end of the second edge 4002. According to an embodiment, since at least parts of the first edge 4001, the third edge 4003, and the fourth edge 4004 of the flexible display 400 may be disposed between the first housing 310 and the first protective frame 340, they may be disposed not to be seen from the outside. According to an embodiment, since at least parts of the second edge 4002, the third edge 4003, and the fourth edge 4004 of the flexible display 400 may be disposed between the second housing 320 and the second protective frame 350, they may be disposed not to be seen from the outside.

According to various embodiments, a pair of protective frames 340 and 350 (e.g., first protective frame 340 and second protective frame 350) may be omitted in the folding area h3 corresponding to the hinge device 364 for folding and unfolding operations of the first housing 310 and the second housing 320 based on the hinge device 364. According to an embodiment, in the folding area h3, the electronic device 300 may include a protective structure 500 disposed to protect at least a part of the third edge 4003 and at least a part of the fourth edge 4004 of the flexible display 400 exposed to the outside. According to an embodiment, the edges of the flexible display 400 exposed through the folding area h3 may be disposed not to be seen from the outside at least partly through the protective structure 500. According to an embodiment, the protective structure 500 may include a support structure 501 disposed to be supported through at least a part of the hinge device 364, and a blocking member 502 supported by the support structure 501 and disposed to at least partly hide the edges of the flexible display 400 from the outside. In a certain embodiment, in order to support the blocking member 502 of a film type, the support structure 501 may include wing structures rotatably installed on left and right sides of the support structure 501.

According to various embodiments, static electricity may flow into the electronic device 300 through a gap between the flexible display 400 and the first protective frame 340, and/or between the flexible display 400 and the second protective frame 350. According to an embodiment, since the inflow static electricity is induced to at least one conductive structure (e.g., conductive plate) electrically connected to the common ground of the electronic device 300 through the conductive member according to embodiments of the disclosure, the malfunction and damage of the display panel (e.g., display panel 420 of FIG. 5) can be prevented. According to an embodiment, the conductive member may at least partly include a conductive material, such as copper (Cu), nickel (Ni), or silver (Ag).

Figure 5:
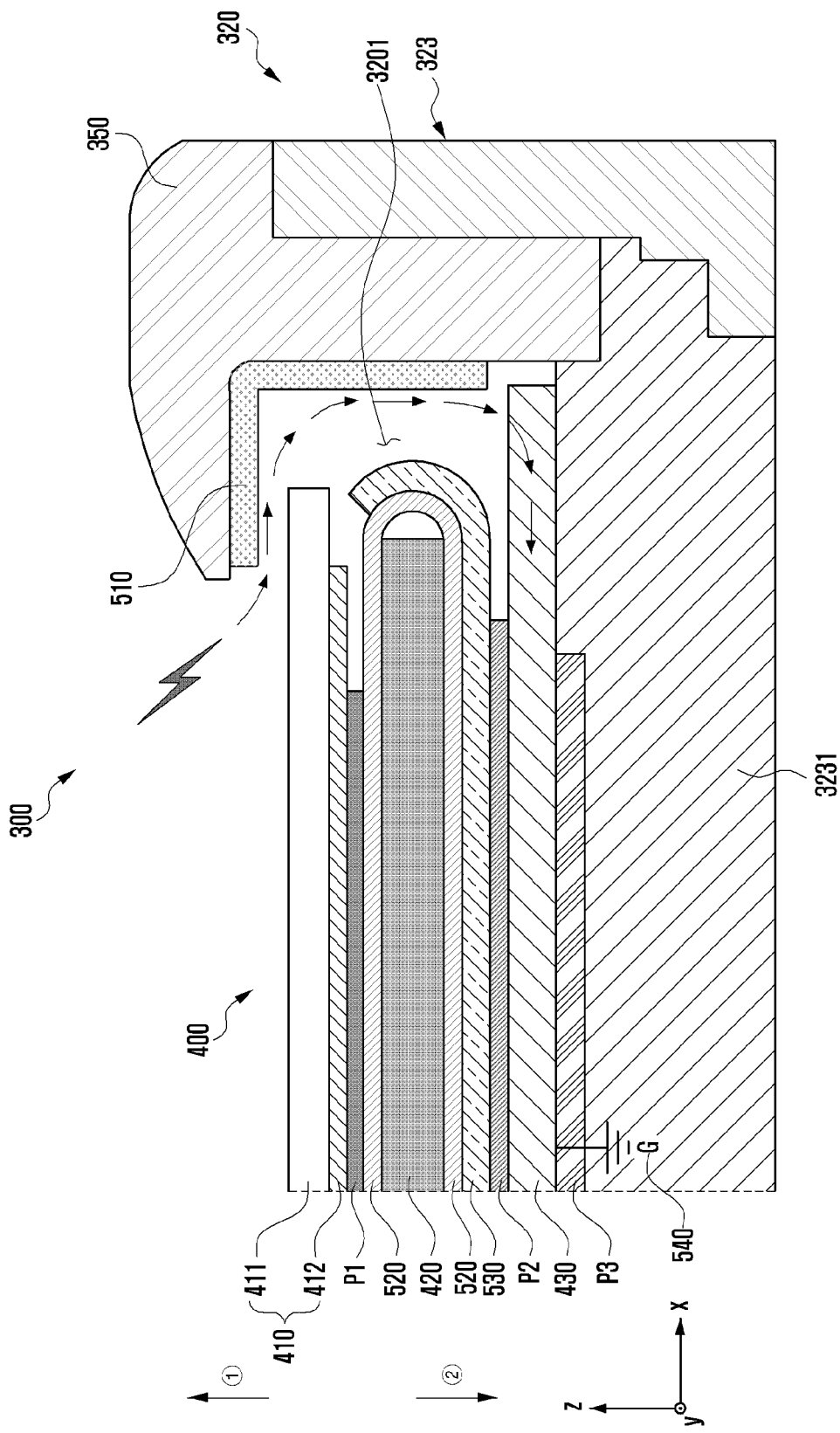
FIG. 5 is a partial cross-sectional view of an electronic device as seen from line 7-7 of FIG. 4B according to an embodiment of the disclosure.

FIG. 5 is a partial cross-sectional view of an electronic device as seen from line 7-7 of FIG. 4B according to an embodiment of the disclosure.

Referring to FIG. 5, the electronic device 300 may include the second housing 320 (hereinafter, "housing") including the second side member 323 (hereinafter, "side member"), the second protective frame 350 (e.g., decorative member or deco) (hereinafter, "protective frame") disposed on at least a part of the side member 323, and the flexible display 400 disposed between the side member 323 and the protective frame 350. According to an embodiment, the flexible display 400 may at least partly extend from the side member 323 to the second space of the housing 320, or may be disposed to be supported through the second conductive support member 3231 (hereinafter, "conductive support member") structurally combined. According to an embodiment, at least a part of the edge of the flexible display 400 may be disposed in an inner space 3201 formed through at least a part of the side member 323, the protective frame 350, and the conductive support member 3231. According to an embodiment, the edge of the flexible display 400 may be hidden by the protective frame 350 so as not to be seen from the outside.

According to various embodiments, the flexible display 400 may include a window layer 410, a display panel 420, a conductive plate 430, an electrode member 520, and/or a protect layer 530. According to an embodiment, the flexible display 400 may include the window layer 410 disposed on a side facing the first direction (direction ①) of the display panel 420, and the conductive plate 430 disposed on a side facing the second direction (direction ②) that is opposite to the first direction (direction ①) of the display panel 420. According to an embodiment, the window layer 410 may include a polymer layer 411 (e.g., PET) and a glass layer 412 (e.g., UTG or polyimide) disposed under the polymer layer 411. According to an embodiment, the display panel 420 of the flexible display 400 may be at least partly surrounded by the electrode member 520 for supplying a power. According to an embodiment, the flexible display 400 may include the protect layer 530 for protecting the electrode member 520. For example, the protect layer 530 may be disposed in the form of at least partly surrounding the display panel 420 and the electrode member 520. The protect layer 530 may be implemented by a non-conductive material so that the static electricity flowing from the outside is not induced.

According to an embodiment, respective layers may be attached to each other through adhesive members P1 and P2. According to an embodiment, the conductive plate 430 of the flexible display 400 may be attached to the conductive support member 3231 through an adhesive member P3. According to an embodiment, the electronic device 300 may further include a conductive member 510 for inducing the static electricity flowing from the outside. According to an embodiment, the conductive member 510 may be disposed through at least one combination method of bonding, taping, fusion, and/or structural combination based on the shape of the protective frame 350. According to an embodiment, when the external static electricity flows into the inner space 3201 through a gap between the polymer layer 411 and the protective frame 350, the conductive member 510 may serve to induce the inflow static electricity. According to an embodiment, the conductive member 510 may be disposed so as to discharge the inflow static electricity to the common ground 540 through the conductive plate 430. According to an embodiment, the conductive member 510 may be disposed to be spaced apart from the conductive plate 430 by a predetermined distance. For example, the conductive member 510 may be disposed to be apart from the conductive plate 430 by a distance enough to induce the static electricity without physically contacting the conductive plate 430. According to an embodiment, the conductive plate 430 may function as an antenna radiator at least partly.

According to various embodiments, the static electricity having flowed into the inner space 3201 of the electronic device 300 through a gap between the edge of the flexible display 400 and the protective frame 350 may be induced to the conductive plate 430 electrically connected to the common ground 540 of the electronic device 300 based on the conductive member 510. According to an embodiment, the protect layer 530 may be disposed in the form of surrounding the display panel 420 and the electrode member 520 at least partly in accordance with bending properties (e.g., bending characteristics) of the flexible display 400. For example, the electrode member 520 may protrude into the inner space 3201 at least partly. According to an embodiment, since the static electricity having flowed from the outside is induced based on the conductive member 510, the electronic device 300 can reduce the situation in which the static electricity flows into the electrode member 520.

According to various embodiments, the conductive member 510 may be disposed based on the protective frame 350, and may be arranged in the form of discontinuous patterns. The conductive member 510 may include a plurality of patterns, and may be implemented in the form in which the plurality of patterns are arranged to be spaced apart from each other at predetermined intervals. According to various embodiments, in order to reduce the area in which the radiation area of the antenna and the conductive member 510 overlap each other in the electronic device 300, the conductive member 510 may be designed in the form of the discontinuous patterns. For example, the conductive plate 430 and the conductive support member 3231 may be utilized as antenna radiators at least partly. According to an embodiment, as the overlap area between the conductive plate 430 and the conductive support member 3231 and the conductive member 510 becomes smaller, the antenna radiation performance can be further improved. According to an embodiment, in order to induce the external static electricity, the conductive member 510 may include at least one pattern formed on the conductive plate 430, being spaced apart from each other by a predetermined distance. The at least one pattern may be arranged in the form in which the patterns are apart from each other. According to an embodiment, the antenna may radiate a wireless signal through a gap between the at least one pattern, and thus the antenna radiation performance can be improved.

According to various embodiments, an electronic device may include a first housing, a second housing foldably connected to the first housing through a hinge device, a flexible display disposed to be supported by the second housing through the hinge device from the first housing, and a protective frame disposed on the second housing with edges of the flexible display interposed, wherein a conductive member is disposed based on at least one pattern between the protective frame and the edges of the flexible display According to an embodiment, the flexible display may include a window layer, a display panel disposed under the window layer corresponding to the second housing, and a conductive plate disposed under the display panel and electrically connected to a common ground.

According to an embodiment, the flexible display may further include an electrode member disposed in a form of surrounding the display panel, and a protect layer disposed in a form of at least partly surrounding the electrode member.

According to an embodiment, the protect layer may be implemented by a non-conductive material, and static electricity flowing from an outside may not be induced.

According to an embodiment, the protect layer may protect the electrode member so that external static electricity is not applied to the electrode member, and may be at least partly bendable corresponding to bending of the display panel.

According to an embodiment, the conductive member may have one end disposed between the protective frame and the edges of the flexible display and the other end disposed adjacent to the conductive plate.

According to an embodiment, the conductive member may be disposed to induce static electricity flowing from an outside and to discharge the static electricity to the common ground through the conductive plate adjacent to the other end of the conductive member.

According to an embodiment, the conductive plate may function as an antenna radiator at least partly.

According to an embodiment, the flexible display may be implemented in a form in which the window layer, the display panel, and the conductive plate are laminated using an adhesive member.

According to an embodiment, the conductive member may be disposed to be physically apart from the conductive plate.

According to an embodiment, the conductive member may be disposed to at least partly overlap the edges of the flexible display as seen from above of the flexible display.

According to an embodiment, the edge of the flexible display may be disposed not to be seen from an outside through the protective frame.

According to an embodiment, the conductive member may include a conductive material, such as copper (Cu), nickel (Ni), or silver (Ag).

According to an embodiment, the conductive member may be disposed through at least one combination method of bonding, taping, fusion, and/or structural combination based on a shape of the protective frame.

According to an embodiment, the protective frame may form a recess structure based on the at least one pattern.

According to an embodiment, the conductive member may include at least one opening structure based on predetermined intervals.

According to an embodiment, the size of the at least one opening structure may be determined based on a radiation performance of an antenna.

According to an embodiment, the at least one pattern may be independently disposed spaced apart from each other based on predetermined intervals.

According to an embodiment, the at least one pattern may be arranged spaced apart at predetermined intervals.

According to an embodiment, an interval between the at least one pattern may be determined based on a radiation performance of an antenna.

Figure 6:
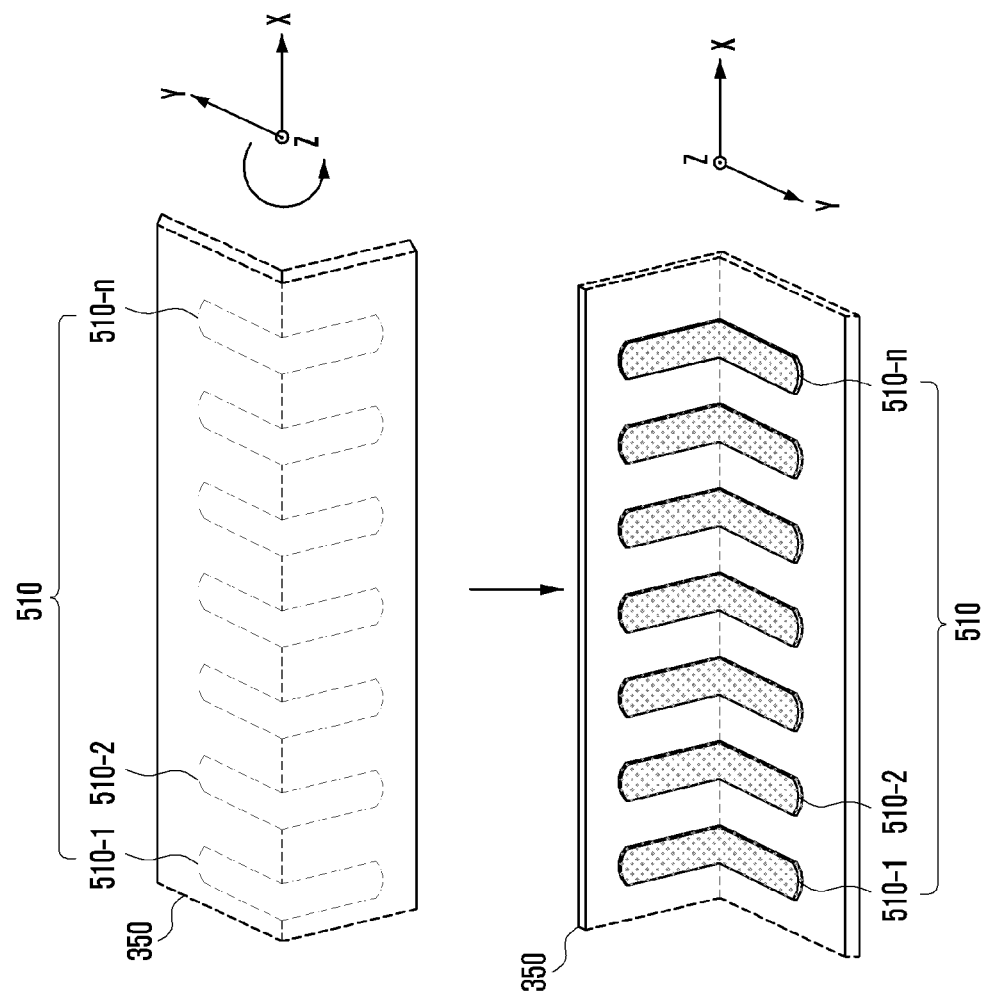
FIG. 6 is a view illustrating a protective frame corresponding to an area C1 of FIG. 4B according to an embodiment of the disclosure.

FIG. 6 is a view illustrating a protective frame corresponding to an area C1 of FIG. 4B according to an embodiment of the disclosure.

Referring to FIG. 6, a protective frame 350 disposed at the edge of the flexible display (e.g., flexible display 400 of FIG. 4B) of the electronic device (e.g., electronic device 300 of FIG. 4B) are illustrated in an enlarged manner.

According to various embodiments, the protective frame 350 may include at least one conductive member 510 (e.g., 510-1, 510-2 to 510-n) arranged at predetermined intervals. According to an embodiment, the at least one conductive member 510 may induce the static electricity flowing through a gap (e.g., space) between the flexible display 400 and the protection frame 350. For example, one end of the at least one conductive member 510 may be disposed adjacent to the gap between the flexible display 400 and the protective frame 350, and the other end of the at least one conductive member 510 may be disposed adjacent to the conductive plate (e.g., conductive plate 430 of FIG. 5) of the electronic device 300. The at least one conductive member 510 may be utilized as a path for inducing the static electricity flowing from the outside. The at least one conductive member 510 may be implemented to include a column-shaped pattern.

According to an embodiment, the at least one conductive member 510 may be disposed on the protective frame 350 at least partly through at least one combination method among bonding, taping, fusion, and/or structural combination. According to an embodiment, the at least one conductive member 510 may be included in a conductive tape, and the conductive tape may be implemented in the form in which it is attached to the protective frame 350 at least partly.

Figure 7:
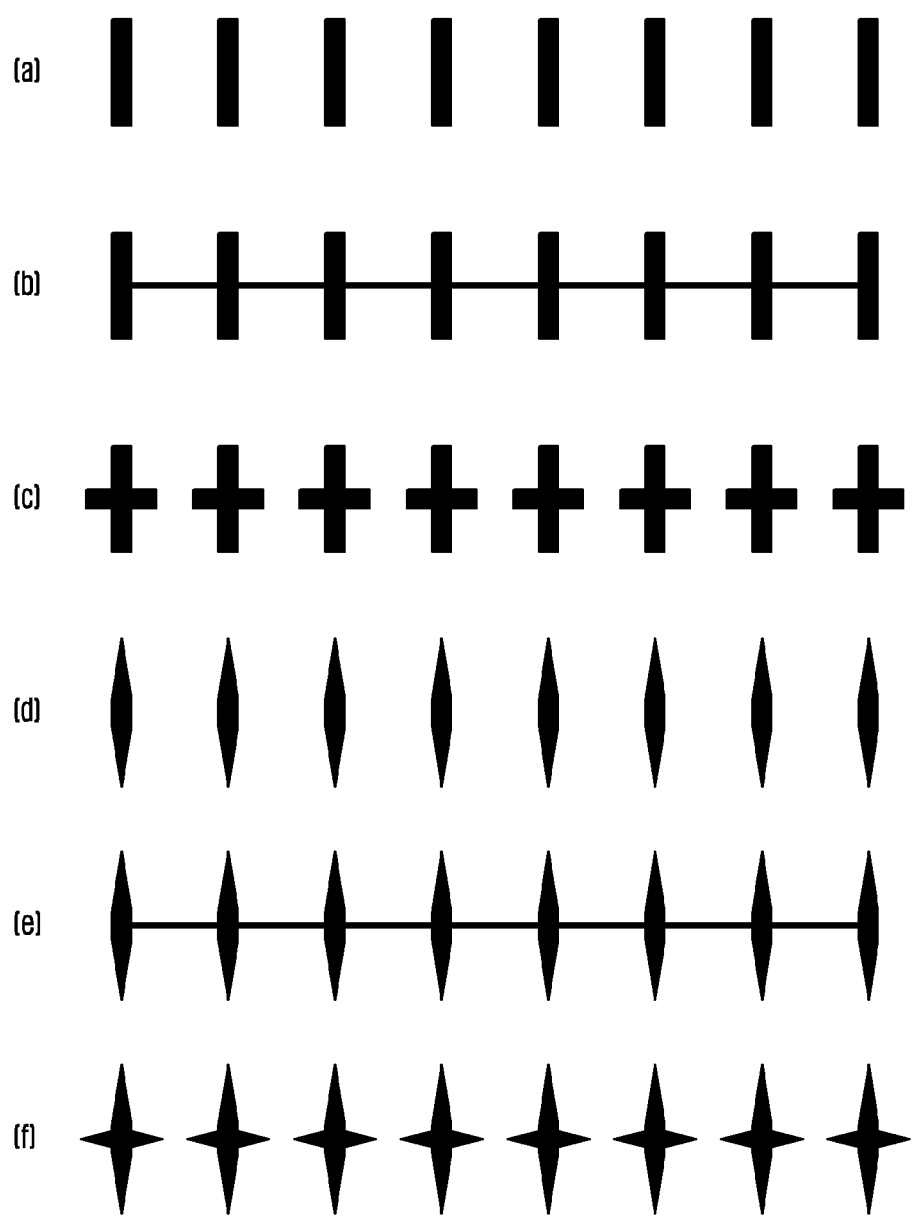
FIG. 7 is a view illustrating at least one conductive member including various pattern structures according to an embodiment of the disclosure.

FIG. 7 is a view illustrating at least one conductive member including various pattern structures according to an embodiment of the disclosure.

Referring to FIG. 7, at least one conductive member (e.g., conductive member 510 of FIG. 5) arranged at predetermined intervals on the protective frame (e.g., protective frame 350 of FIG. 4B) of the electronic device (e.g., electronic device 300 of FIG. 4B) is illustrated. According to an embodiment, the at least one conductive member 510 may be implemented as various types of pattern structures (e.g., [a], [b], [c], [d], [e], and [f]) being arranged at predetermined intervals. According to an embodiment, since the at least one conductive member 510 includes patterns arranged to be spaced apart from each other at predetermined intervals, deterioration of the antenna radiation performance can be reduced. According to an embodiment, since the pattern structure is not implemented as a linear pattern, but is arranged in the form of discontinuous patterns, a wireless communication signal can radiate through a space between the discontinuous patterns. The at least one conductive member 510 includes the at least one pattern arranged in the form of discontinuous patterns based on the predetermined intervals, and thus the antenna radiation performance can be improved. According to an embodiment, the at least one conductive member 510 is not limited to the pattern structure illustrated in FIG. 7, but may include various patterns in the form in which the patterns are apart from each other at predetermined intervals.

Figure 8A:
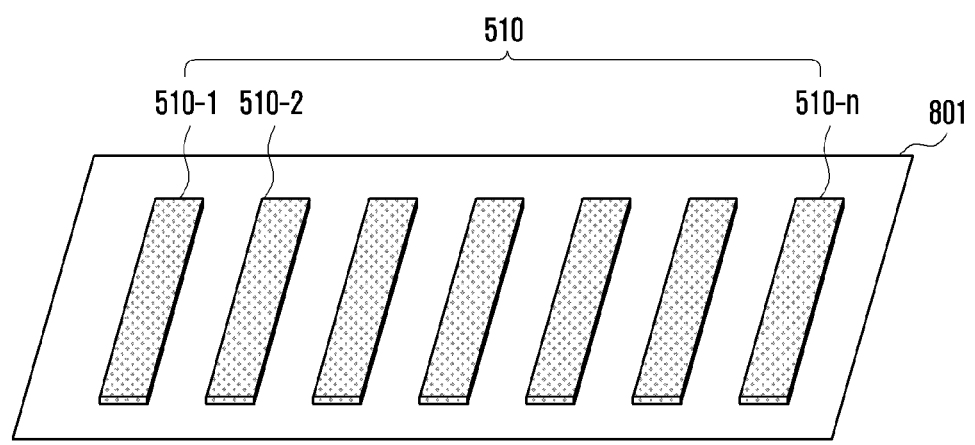
FIG. 8A is a view illustrating an embodiment in which at least one pattern is formed on a tape according to an embodiment of the disclosure.

FIG. 8A is a view illustrating an embodiment in which at least one pattern is formed on a tape according to an embodiment of the disclosure.

Referring to FIG. 8A, at least one conductive member (e.g., conductive member 510 of FIGS. 5, 510-1, 510-2 to 510-n) arranged at predetermined intervals on a tape 801. For example, the at least one conductive member 510 may be disposed based on the predetermined intervals in the form in which it is vaporized on one tape 801. According to an embodiment, the tape 801 may have a size determined based on the shape of the protective frame (e.g., protective frame 350 of FIG. 5), and may be attached to the protective frame 350. According to an embodiment, since the tape 801, on which the at least one conductive member 510 is vaporized, is attached to the protective frame 350, the manufacturing cost can be saved.

Figure 8B:
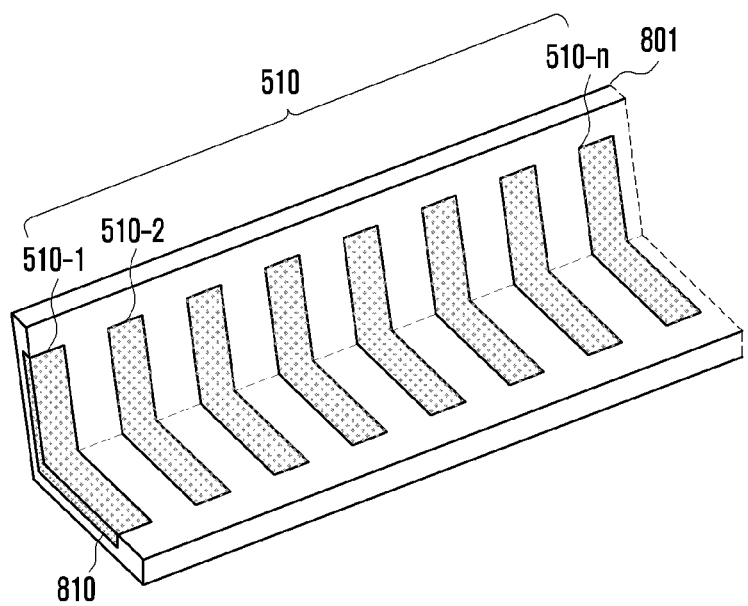
FIG. 8B is a view illustrating an embodiment in which at least one pattern is disposed on a protective frame having a recess structure according to an embodiment of the disclosure.

FIG. 8B is a view illustrating an embodiment in which at least one pattern is disposed on a protective frame having a recess structure according to an embodiment of the disclosure.

Referring to FIG. 8B, a protective frame (e.g., protective frame 350 of FIG. 4B) at least partly surrounding the edge of the flexible display (e.g., flexible display 400 of FIG. 4B) of the electronic device (e.g., electronic device 300 of FIG. 4B) is illustrated. According to an embodiment, the protective frame 350 may be designed to include at least one recess structure 810. According to an embodiment, the protective frame 350 may be implemented in the form in which the at least one conductive member (e.g., conductive member 510 of FIGS. 5, 510-1, 510-2 to 510-n) is disposed based on the at least one recess structure 810.

Figure 8C:
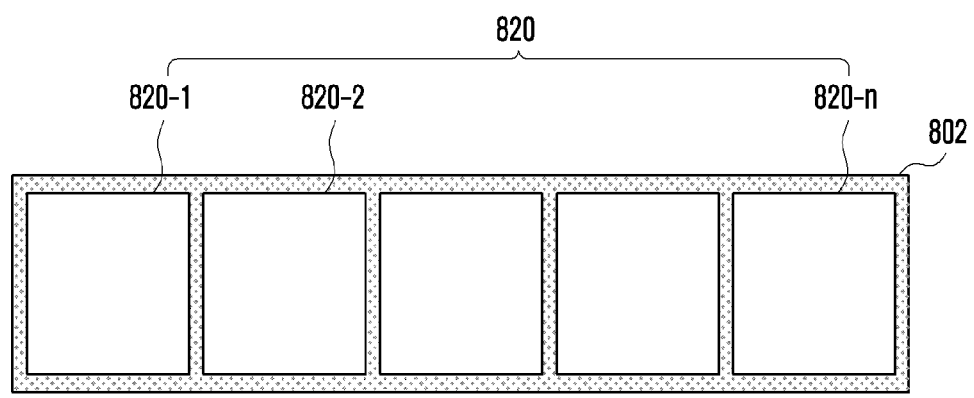
FIG. 8C is a view illustrating an embodiment in which at least one opening structure is formed on a conductive tape according to an embodiment of the disclosure.

FIG. 8C is a view illustrating an embodiment in which at least one opening structure is formed on a conductive tape according to an embodiment of the disclosure.

Referring to FIG. 8C, a conductive tape 802 in which at least one opening structure 820 (e.g., opening 820-1, 820-2 to 820-n) is formed at predetermined intervals is illustrated. For example, the conductive tape 802 may include at least one opening structure 820 having a predetermined size. The conductive tape 802 may have a size determined based on the shape of the protective frame (e.g., protective frame 350 of FIG. 5), and may be attached to the protective frame 350. According to an embodiment, the at least one opening structure 820 may be used as a transmission path of a wireless communication signal. According to an embodiment, as the size of the at least one opening structure 820 becomes larger, the antenna radiation performance can be further improved. The electronic device 300 may be designed so that the wireless communication signal is radiated through the at least one opening structure 820.

Figure 9:
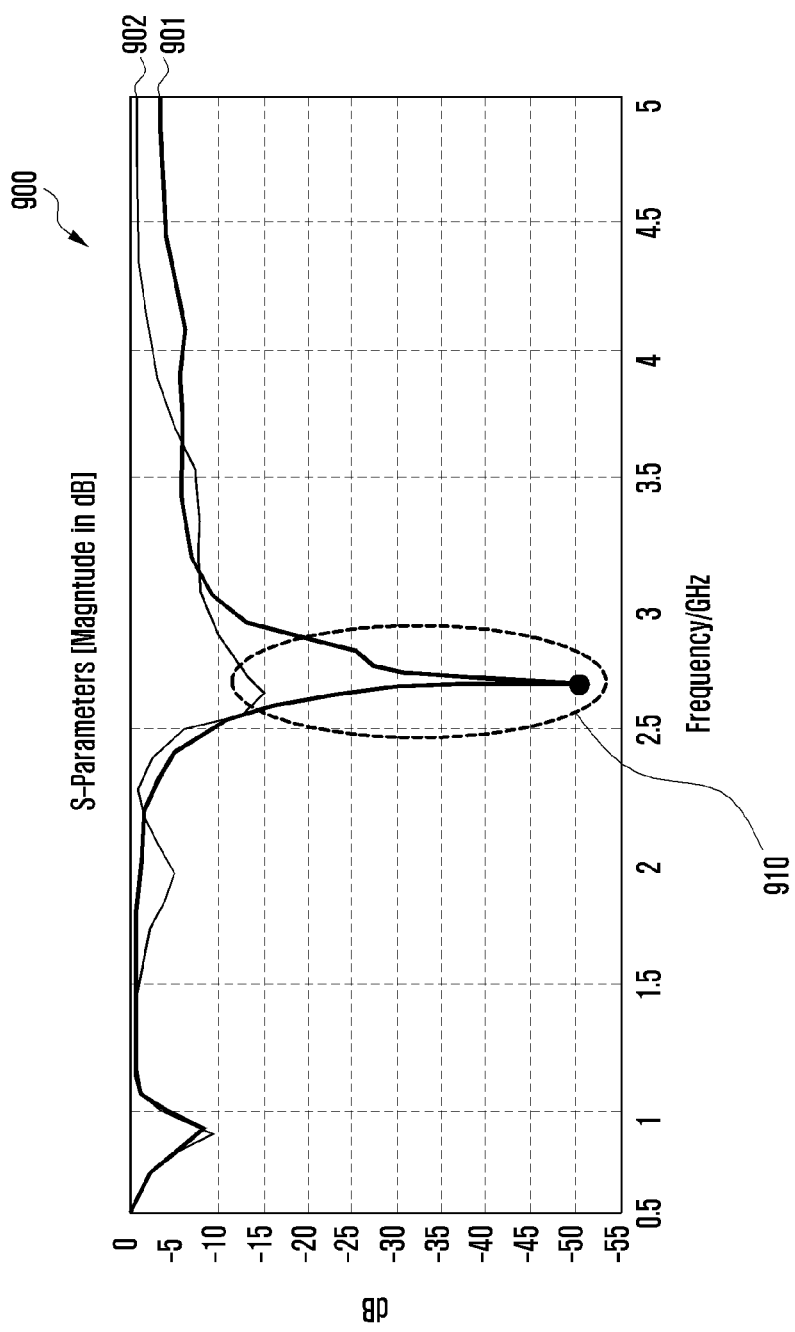
FIG. 9 is a graph showing the degree of improvement of an antenna performance using a conductive tape on which at least one pattern is formed according to an embodiment of the disclosure.

FIG. 9 is a graph showing the degree of improvement of an antenna performance using a conductive tape on which at least one pattern is formed according to an embodiment of the disclosure.

Referring to FIG. 9, the graph 900 illustrates a first line 901 representing the antenna performance of a first electronic device using a conductive tape on which at least one pattern is formed, and a second line 902 representing the antenna performance of a second electronic device using a conductive tape on which the pattern is not formed.

According to various embodiments, the at least one pattern may be disposed on the conductive tape at least partly so as to induce the static electricity flowing into the first electronic device. The at least one pattern may be implemented in the form of discontinuous patterns. According to an embodiment, a plurality of patterns may be arranged apart from each other at predetermined intervals, and a radiation path of the antenna mounted inside the first electronic device can be secured through areas formed between the patterns. Since the first electronic device uses the conductive tape on which the at least one pattern is formed, the antenna performance can be improved.

Referring to FIG. 9, through experiments, in case of the first electronic device, the gain of a resonance frequency can be measured as about 6.07 dBi in a band 910 of about 2.7 GHZ (e.g., main frequency band), whereas in case of the second electronic device, the gain of the resonance frequency can be measured as about 5.07 dBi in the band 910 of about 2.7 GHZ. For example, referring to the first line 901 corresponding to the first electronic device, about −51.56 dB can be measured in the band of about 2.7 GHZ, whereas referring to the second line 902 corresponding to the second electronic device, about −15 dB can be measured in the band of about 2.7 GHZ. For example, the measurement value of the first electronic device in the band of about 2.7 GHZ, which is about −51.56 dB, can be calculated as about 6.07 dBi, and the measurement value of the second electronic device, which is about −15 dB, can be calculated as about 5.07 dBi by applying a dBi measurement formula. Referring to FIG. 9, in case of performing the wireless communication based on the band of about 2.7 GHz, it can be confirmed that the antenna performance of the first electronic device using the conductive tape on which at least one pattern is formed is improved by about 1 dBi as compared with the antenna performance of the second electronic device. According to an embodiment, it may be defined that as the antenna gain becomes higher, the antenna performance is further improved. According to an embodiment, since the electronic device uses the conductive tape on which at least one pattern is formed in the form of discontinuous patterns, the antenna performance can be improved.

According to various embodiments, since the electronic device uses the conductive tape on which at least one pattern is formed, the situation in which the static electricity flowing into the electronic device flows into the electrode member can be reduced. The at least one pattern may be arranged in the form of discontinuous patterns, and through the area of the discontinuous patterns, the electronic device can secure the radiation path of the antenna. According to an embodiment, since the conductive tape on which the at least one pattern is formed is used, the radiation performance of the antenna can be improved.

The electronic devices according to various embodiments disclosed in this document may be various types of devices. The electronic device may include, for example, a portable communication device (e.g., smart phone), a computer device, a portable multimedia device, a portable medical device, a camera, a wearable device, or a home appliance. The electronic devices according to embodiments of this document are not limited to the above-described devices.

It should be appreciated that various embodiments of the disclosure and the terms used therein are not intended to limit the technological features set forth herein to particular embodiments and include various changes, equivalents, and/or replacements for a corresponding embodiment. With regard to the description of the drawings, similar reference numerals may be used to refer to similar elements. A singular form of a noun corresponding to an item may include one or a plurality of items, unless the relevant context clearly indicates otherwise. As used in the disclosure, each of such phrases as "A or B," "at least one of A and B," "at least one of A or B," "A, B, or C," "at least one of A, B, and C," or "at least one of A, B, or C" may include any one or all possible combinations of the items enumerated together. Such terms as "$1^{st}$," "$2^{nd}$," "first," or "second" may be used to simply distinguish a corresponding component from another, and does not limit the components in other aspect (e.g., importance or order). If it is described that if an element (e.g., a first element) is referred to, with or without the term "operatively" or "communicatively", as "connected to," or "coupled to" another element (e.g., a second element), it means that the element may be connected to the other element directly (e.g., by wire), wirelessly, or via a third element.

As used in the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments of the disclosure may be implemented as software (e.g., a program) including one or more instructions stored in a machine-readable storage medium (e.g., internal memory 136 or external memory 138) that is readable by a machine (e.g., an electronic device 100). For example, a processor of the machine (e.g., electronic device 100) may call at least one of one or more stored instructions from the storage media and may execute the called instructions. This enables the machine to perform at least one function in accordance with the at least one called instructions. The one or more instructions may include a code generated or executed by a complier or an interpreter. The machine-readable storage medium may be provided in the form of a non-transitory storage medium. Here, the term "non-transitory" simply means that the storage medium is a tangible device, and does not include a signal (e.g., electromagnetic waves), but this term does not differentiate between data semi-permanently stored in the storage medium and temporarily stored in the storage medium.

According to an embodiment, a method according to various embodiments disclosed in the disclosure may be included and provided in a computer program product. The computer program product may be traded as a product between a seller and a buyer. The computer program product may be distributed in the form of a machine-readable storage medium (e.g., compact disc read only memory (CD-ROM)), or be directly distributed online (e.g., download or upload) via an application store (e.g., Play Store™) or between two user devices (e.g., smartphones). In case of online distribution, at least a part of the computer program product may be temporarily generated or at least temporarily stored in the machine-readable storage medium, such as memory of a manufacturer's server, a server of an application store, or a relay server.

According to various embodiments, each component (e.g., module or program) of the above-described components may include a single entity or multiple entities, and some of the plurality of entities may be disposed separately from other components. According to various embodiments, one or more of the above-described corresponding components or operations may be omitted, or one or more other components or operations may be added. Alternatively or additionally, a plurality of components (e.g., modules or programs) may be integrated into a single component, and the integrated single component may still perform one or more functions of the plurality of components in the same or similar manner as they are performed by the corresponding constituent elements among the plurality of constituent elements before being integrated. According to various embodiments, operations performed by the module, the program, or another component may be carried out sequentially, in parallel, repeatedly, or heuristically, or one or more of the operations may be executed in a different order or omitted, or other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
   a first housing:
   a second housing foldably connected to the first housing through a hinge device:
   a flexible display disposed at the first housing and the second housing, the flexible display comprising:
     a display panel, and
     a conductive plate disposed under the display panel and electrically connected to a common ground;
   a protective frame at least partially covering an edge of the flexible display; and
   a conductive member disposed on an inner surface of the protective frame,
   wherein the conductive member comprises a first portion extending along a longitudinal direction of the protective frame corresponding to the edge of the flexible display and at least two second portions extending from the first portion toward the conductive plate, and
   wherein ends of the at least two second portions are disposed adjacent to the conductive plate.

2. The electronic device of claim 1,
   wherein the flexible display comprises:
     a window layer disposed on top of the display panel, and
   wherein the conductive member comprises a plurality of conductive members.

3. The electronic device of claim 2, wherein the flexible display further comprises:
   an electrode member disposed to surround the display panel; and
   a protect layer disposed to at least partly surround the electrode member.

4. The electronic device of claim 3, wherein the protect layer includes a non-conductive material; and static electricity flowing from an outside is not induced.

5. The electronic device of claim 3, wherein the protect layer protects the electrode member so that external static electricity is not applied to the electrode member, and the protect layer is at least partly bendable corresponding to a bending of the display panel.

6. The electronic device of claim 2, wherein a first end of the conductive member is disposed between the protective frame and the edge of the flexible display and a second end of the conductive member is disposed adjacent to the conductive plate.

7. The electronic device of claim 6, wherein the conductive member is configured to provide an electrical path that allows static electricity applied from an outside through a gap between the edge of the flexible display and the protective frame to be transmitted to the conductive plate.

8. The electronic device of claim 2, wherein the conductive plate at least partly functions as an antenna radiator.

9. The electronic device of claim 2, wherein the flexible display is implemented such that the window layer, the display panel, and the conductive plate are laminated using an adhesive member.

10. The electronic device of claim 2, wherein the conductive member is physically spaced apart from the conductive plate.

11. The electronic device of claim 1, wherein the conductive member at least partly overlaps the edge of the flexible display as seen from above of the flexible display.

12. The electronic device of claim 1, wherein the edge of the flexible display is disposed not to be seen from an outside through the protective frame.

13. The electronic device of claim 1, wherein the conductive member comprises a conductive material including one of copper (Cu), nickel (Ni), or silver (Ag).

14. The electronic device of claim 1, wherein the conductive member is disposed through at least one combination method of bonding, taping, fusion, or structural combination based on a shape of the protective frame.

15. The electronic device of claim 1, wherein the protective frame forms a recess structure based on a shape of the conductive member.

16. The electronic device of claim 1, wherein the conductive member comprises at least one opening structure based on predetermined intervals.

17. The electronic device of claim 16, wherein a size of the at least one opening structure is determined based on a radiation performance of an antenna.

18. The electronic device of claim 1,
   wherein the conductive member is independently disposed spaced apart from each other based on predetermined intervals, and
   wherein an interval of the predetermined intervals is determined based on a radiation performance of an antenna.

19. The electronic device of claim 1, wherein the at least two second portions of the conductive member are arranged to be discontinuous.

20. The electronic device of claim 1,
   wherein the at least two second portions of the conductive member are arranged at predetermined intervals on a tape to which the at least two second portions are vapor-deposited, and
   wherein the tape has a size determined based on a shape of the protective frame.

21. The electronic device of claim 1, wherein the at least two second portions of the conductive member extend in a direction perpendicular to the longitudinal direction of the first portion of the conductive member.

* * * * *